US011296098B2

(12) United States Patent
Lee et al.

(10) Patent No.: US 11,296,098 B2
(45) Date of Patent: Apr. 5, 2022

(54) NONVOLATILE TERNARY MEMORY DEVICE USING TWO-DIMENSIONAL FERROELECTRIC MATERIAL AND METHOD OF MANUFACTURING THE SAME

(71) Applicant: UNIST (ULSAN NATIONAL INSTITUTE OF SCIENCE AND TECHNOLOGY), Ulsan (KR)

(72) Inventors: Jun Hee Lee, Ulsan (KR); Ho Sik Lee, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 206 days.

(21) Appl. No.: 16/699,994

(22) Filed: Dec. 2, 2019

(65) Prior Publication Data
US 2021/0151446 A1    May 20, 2021

(30) Foreign Application Priority Data
Nov. 14, 2019    (KR) .......................... 10-2019-0146132

(51) Int. Cl.
| H01L 21/02 | (2006.01) |
| H01L 27/11507 | (2017.01) |
| G11C 15/04 | (2006.01) |
| H01L 49/02 | (2006.01) |

(52) U.S. Cl.
CPC ...... *H01L 27/11507* (2013.01); *G11C 15/046* (2013.01); *H01L 28/60* (2013.01)

(58) Field of Classification Search
CPC .. H01L 27/11507; H01L 28/60; G11C 15/046

USPC ...................................................... 365/185.09
See application file for complete search history.

(56) References Cited

U.S. PATENT DOCUMENTS

| 8,268,713 | B2 * | 9/2012 | Yamagishi | .......... H01L 45/1233 |
| | | | | 438/608 |
| 9,959,920 | B2 * | 5/2018 | Liu | .......... H01L 28/60 |
| 10,186,595 | B2 * | 1/2019 | Rondinelli | .......... H01L 29/4966 |
| 10,242,989 | B2 * | 3/2019 | Pandey | .......... H01L 28/55 |
| 2002/0063271 | A1 * | 5/2002 | Kim | .......... H01L 28/55 |
| | | | | 257/295 |
| 2002/0132426 | A1 * | 9/2002 | Shinohara | .......... H01L 27/11507 |
| | | | | 438/257 |
| 2007/0107774 | A1 * | 5/2007 | Jin | .......... H01L 45/04 |
| | | | | 136/258 |
| 2007/0108489 | A1 * | 5/2007 | Nagai | .......... H01L 27/11502 |
| | | | | 257/295 |

(Continued)

FOREIGN PATENT DOCUMENTS

KR    10-1178997 B1    8/2012

*Primary Examiner* — Viet Q Nguyen
(74) *Attorney, Agent, or Firm* — Studebaker & Brackett PC

(57) ABSTRACT

The present disclosure relates to a nonvolatile ternary memory device using a two-dimensional ferroelectric material and a method of manufacturing the same. The method of manufacturing the nonvolatile ternary memory device according to an embodiment of the present disclosure includes (a) forming a lower electrode on a substrate, (b) forming a two-dimensional ferroelectric material on the lower electrode, (c) forming a semiconductor on the two-dimensional ferroelectric material, and (d) forming an upper electrode on the semiconductor.

18 Claims, 12 Drawing Sheets

(56) References Cited

U.S. PATENT DOCUMENTS

| | | | |
|---|---|---|---|
| 2008/0121957 A1* | 5/2008 | Kanaya | H01L 28/57 |
| | | | 257/295 |
| 2008/0258193 A1* | 10/2008 | Yamakawa | H01L 28/55 |
| | | | 257/295 |
| 2009/0095993 A1* | 4/2009 | Ozaki | H01L 27/11507 |
| | | | 257/295 |
| 2010/0117128 A1* | 5/2010 | Hashiura | H01L 28/60 |
| | | | 257/295 |
| 2016/0181259 A1* | 6/2016 | Van Houdt | H01L 29/78391 |
| | | | 365/145 |
| 2019/0058049 A1* | 2/2019 | Then | H01L 29/7786 |
| 2021/0057580 A1* | 2/2021 | Chui | H01L 29/6684 |

* cited by examiner

Configuration 1

Metastable
ΔE = 58.63meV/f.u.

Configuration 2

Ground state
$\Delta E = 0$

Configuration 3

Metastable
ΔE = 23.04meV/f.u.

-1 state 0 state

-1 state

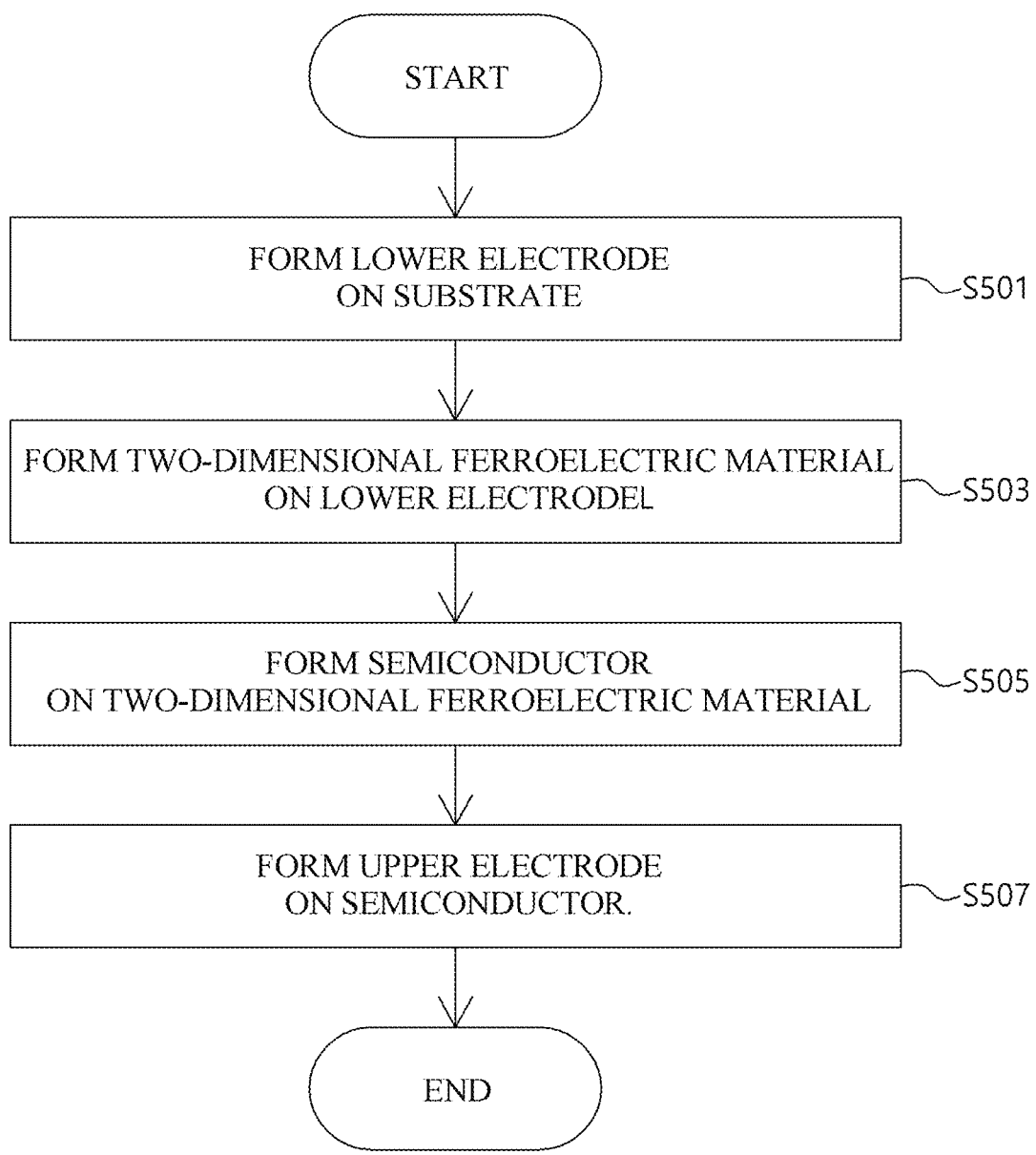

NONVOLATILE TERNARY MEMORY DEVICE USING TWO-DIMENSIONAL FERROELECTRIC MATERIAL AND METHOD OF MANUFACTURING THE SAME

CROSS-REFERENCE TO RELATED APPLICATION

This application claims priority to and the benefit of Korean Patent Application No. 10-2019-0146132, filed on Nov. 14, 2019, the disclosure of which is incorporated herein by reference in its entirety.

BACKGROUND

1. Field of the Invention

The present disclosure relates to a ternary memory device, and more specifically, to a nonvolatile ternary memory device using a two-dimensional ferroelectric material and a method of manufacturing the same.

2. Discussion of Related Art

Modern computer technology is based on binary logic systems. However, as the development of the binary logic systems slows down, a transition to multi-valued logic (MVL) systems is receiving attention.

The MVL may provide an implementation of logic with higher density at low cost in the same chip area. With a smaller number of interconnections, power consumption may be reduced by transmitting more information with the same number of interconnections.

However, with the rapid development of binary logic systems in accordance with Moore's Law, interest in researching the MVL was much lower than interest in researching the binary logic systems. However, the slowing/end of Moore's Law has increased interest in MVL research. The MVL, particularly ternary logic, has significant advantages over binary logic.

However, a memory device to which the conventional ternary logic is applied has a problem in that the structure thereof is complicated and volatile, and research to solve this problem is insufficient.

PRIOR-ART DOCUMENTS

Patent Documents (Patent Document 1) [Patent Document 1] Korea Patent No. 10-1178997

SUMMARY

The present disclosure is directed to providing a nonvolatile ternary memory device using a two-dimensional ferroelectric material and a method of manufacturing the same.

The present disclosure is also directed to providing a nonvolatile ternary memory device capable of representing a ternary state according to a polarization direction of a two-dimensional ferroelectric material, and a method of manufacturing the same.

Objectives of the present disclosure are not limited to the objectives described above, and the other objectives which are not described above will be clearly understood from the following specification.

According to an aspect of the present disclosure, there is provided a method of manufacturing a nonvolatile ternary memory device including (a) forming a lower electrode on a substrate, (b) forming a two-dimensional ferroelectric material on the lower electrode, (c) forming a semiconductor on the two-dimensional ferroelectric material, and (d) forming an upper electrode on the semiconductor.

The two-dimensional ferroelectric material may include at least one from among SnTe, GeTe, and $GeSnTe_2$.

The upper electrode may include a first upper electrode, a second upper electrode, a third upper electrode, and a fourth upper electrode.

The method of manufacturing the nonvolatile ternary memory device may further include, after the process (d), electrically connecting the first upper electrode among the first upper electrode, the second upper electrode, the third upper electrode, and the fourth upper electrode to the lower electrode.

The method of manufacturing the nonvolatile ternary memory device may further include, after the process (d), electrically connecting the first upper electrode to the third upper electrode and electrically connecting the second upper electrode to the fourth upper electrode.

The first upper electrode and the third upper electrode may be disposed in a horizontal polarization direction of the two-dimensional ferroelectric material, and the second upper electrode and the fourth upper electrode may be disposed in a vertical polarization direction of the two-dimensional ferroelectric material.

A voltage applied between the first upper electrode and the lower electrode may be used to adjust a positive direction or a negative direction of the horizontal polarization direction according to a direction in which the voltage is applied.

A magnitude of a tunneling current between the first upper electrode and the lower electrode may be used to represent a ternary state according to a polarization direction of the two-dimensional ferroelectric material.

A voltage between the first upper electrode and the third upper electrode and a voltage between the second upper electrode and the fourth upper electrode may be used for a writing process, and a voltage between the first upper electrode and the lower electrode may be used for a reading process.

The first upper electrode and the second upper electrode may be electrically connected to each other through a conductive line.

According to another aspect of the present disclosure, there is provided a nonvolatile ternary memory device including a substrate, a lower electrode formed on the substrate, a two-dimensional ferroelectric material formed on the lower electrode, a semiconductor formed on the two-dimensional ferroelectric material, and an upper electrode formed on the semiconductor.

The two-dimensional ferroelectric material may include at least one from among SnTe, GeTe, and $GeSnTe_2$.

The upper electrode may include a first upper electrode, a second upper electrode, a third upper electrode, and a fourth upper electrode.

The first upper electrode among the first upper electrode, the second upper electrode, the third upper electrode, and the fourth upper electrode may be electrically connected to the lower electrode.

The first upper electrode may be electrically connected to the third upper electrode, and the second upper electrode may be electrically connected to the fourth upper electrode.

The first upper electrode and the third upper electrode may be disposed in a horizontal polarization direction of the two-dimensional ferroelectric material, and the second upper electrode and the fourth upper electrode may be disposed in a vertical polarization direction of the two-dimensional ferroelectric material.

A voltage applied between the first upper electrode and the lower electrode may be used to adjust a positive direction or a negative direction of the horizontal polarization direction according to a direction in which the voltage is applied.

A magnitude of a tunneling current between the first upper electrode and the lower electrode may be used to represent a ternary state according to a polarization direction of the two-dimensional ferroelectric material.

A voltage between the first upper electrode and the third upper electrode and a voltage between the second upper electrode and the fourth upper electrode may be used for a writing process, and a voltage between the first upper electrode and the lower electrode may be used for a reading process.

The first upper electrode and the second upper electrode may be electrically connected to each other through a conductive line.

Details for achieving the above-described objectives of the present disclosure will be more apparent from the following detailed embodiments taken in conjunction with the accompanying drawings.

However, it should be understood that the present disclosure is not limited to the following disclosed embodiments but may be embodied in many different forms and the present disclosure is provided to be thorough and fully convey the scope of the present disclosure to a person skilled in the art to which the present disclosure pertains (hereinafter, referred to as an "ordinary person").

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which:

FIG. 5 is a view illustrating a method of manufacturing a nonvolatile ternary memory device according to an embodiment of the present disclosure.

DETAILED DESCRIPTION OF THE EMBODIMENTS

Figure 1A:
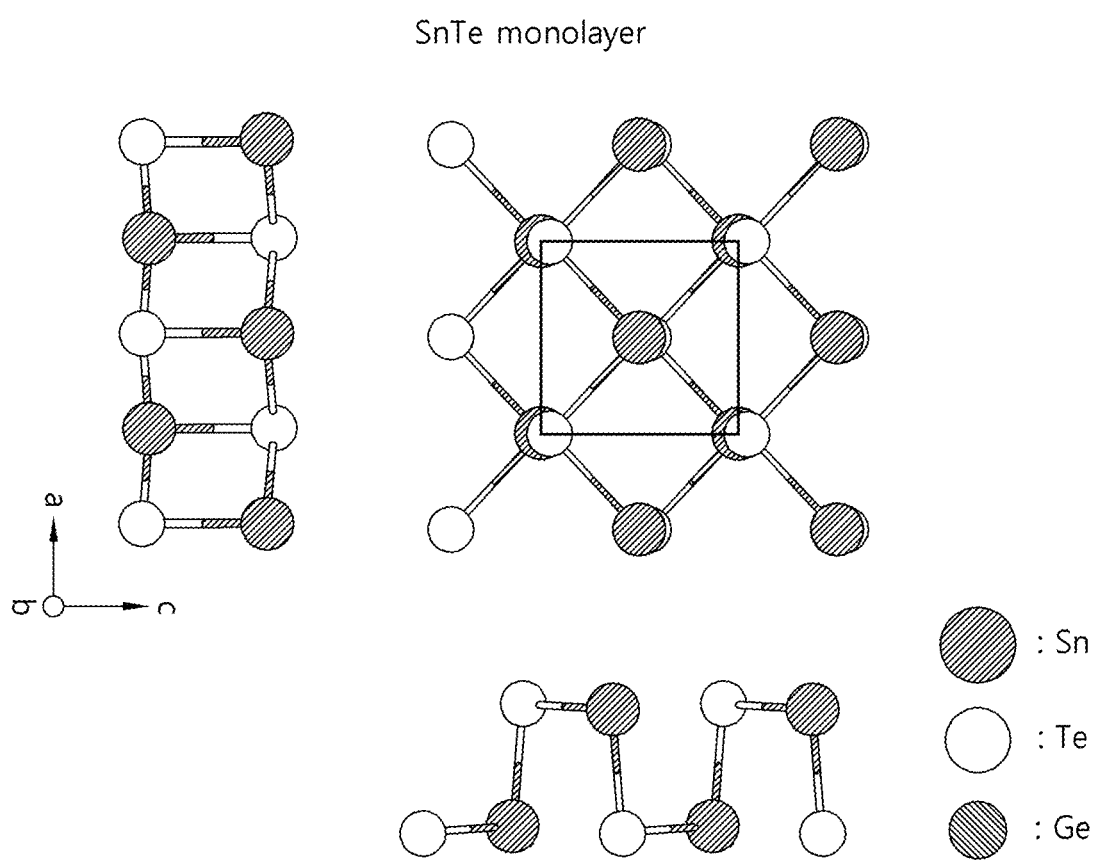
FIG. 1A is a view illustrating a structure of SnTe according to an embodiment of the present disclosure.

The present disclosure may be modified into various forms and may have a variety of embodiments, and, therefore, specific embodiments will be illustrated in the drawings and described in detail.

Various features of the present disclosure disclosed in the appended claims may be better understood in consideration of the drawings and the detailed description thereof. Apparatuses, methods, manufacturing processes, and various embodiments disclosed in the present disclosure are provided for illustrative purposes. The disclosed structural and functional features are intended to allow those skilled in the art to particularly embody various embodiments and are not intended to limit the scope of the disclosure. The terms and phrases disclosed herein are intended to facilitate understanding of the various features of the disclosed disclosure and are not intended to limit the scope of the disclosure.

In the following description of the present disclosure, if a detailed description of a known related art is determined to obscure the gist of the present disclosure, the detailed description thereof will be omitted.

Hereinafter, a nonvolatile ternary memory device using a two-dimensional ferroelectric material and a method of manufacturing the same according to an embodiment of the present disclosure will be described.

Figure 1B:
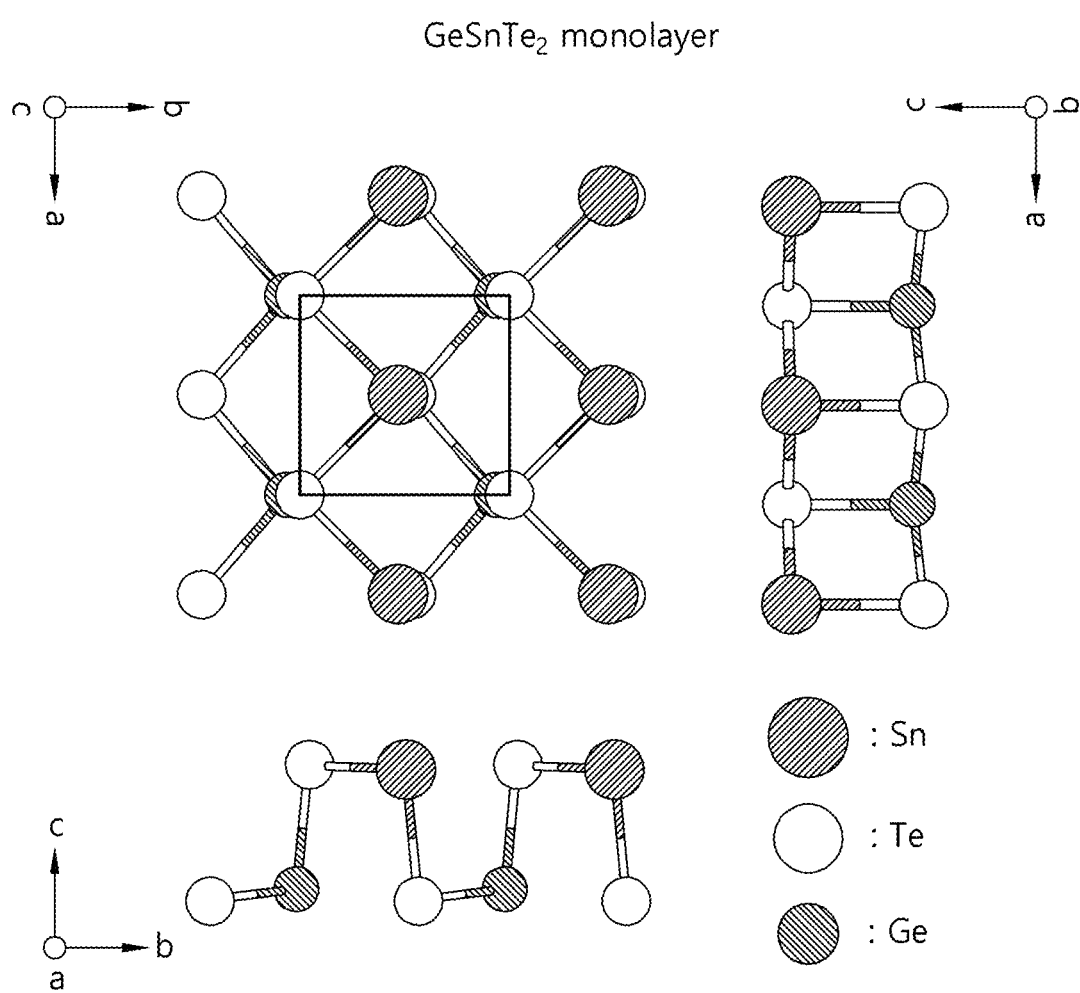
FIG. 1B is a view illustrating a structure of $GeSnTe_2$ according to the embodiment of the present disclosure.
Figure 1C:
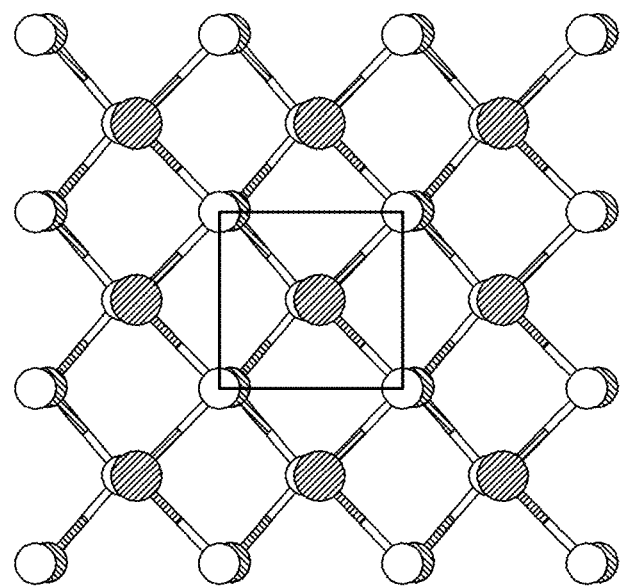
FIG. 1C is a view illustrating a configuration of $GeSnTe_2$ according to the embodiment of the present disclosure.
Figure 1C:
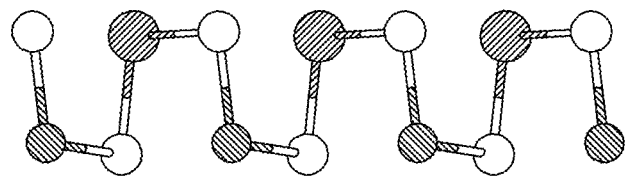
Figure 1D:
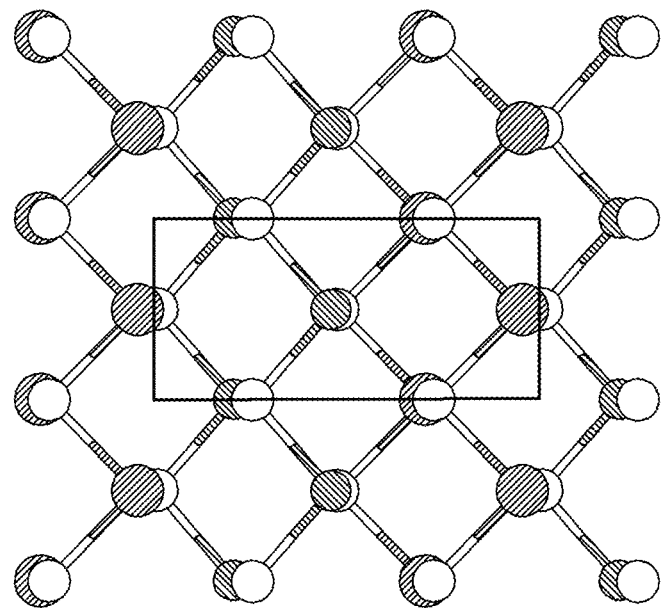
FIG. 1D is a view illustrating another configuration of $GeSnTe_2$ according to the embodiment of the present disclosure.
Figure 1D:
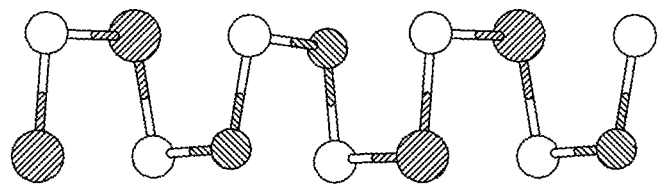
Figure 1E:
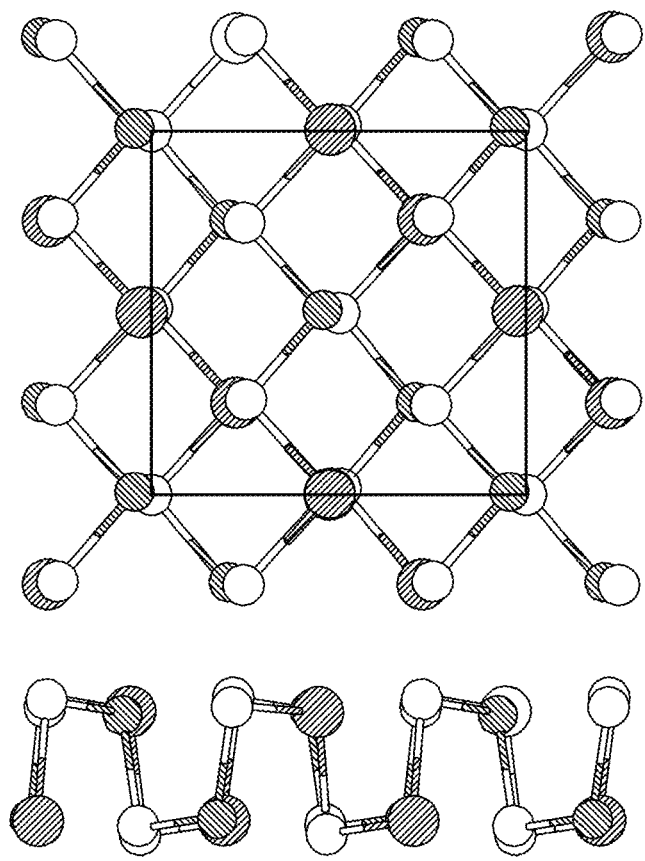
FIG. 1E is a view illustrating still another configuration of $GeSnTe_2$ according to the embodiment of the present disclosure.

FIG. 1A is a view illustrating a structure of SnTe according to the embodiment of the present disclosure. FIG. 1B is a view illustrating a structure of $GeSnTe_2$ according to the embodiment of the present disclosure. FIG. 1C is a view illustrating a configuration of $GeSnTe_2$ according to the embodiment of the present disclosure. FIG. 1D is a view illustrating another configuration of $GeSnTe_2$ according to the embodiment of the present disclosure. FIG. 1E is a view illustrating still another configuration of $GeSnTe_2$ according to the embodiment of the present disclosure.

Referring to FIG. 1A, a conventional ternary memory device is composed of 18 carbon nanotube field-effect transistors (CNFETs) and is somewhat complex and volatile. In order to solve such a problem, the ternary memory device according to the present disclosure is based on SnTe, which is a two-dimensional ferroelectric, and thus may have a simple structure as well as nonvolatile characteristics.

In this case, SnTe may have an orthorhombic structure, and atomic-thick SnTe having a high transition temperature of 270 K may have stable in-plane ferroelectricity. Here, in the case of using SnTe to apply ternary logic to a memory device, when a two-dimensional ferroelectric material such as SnTe has anisotropy, ferroelectric polarization will also have anisotropy, and two different magnitudes of electric polarization depending on a direction may be possible.

Here, the polarization may be used in terms such as electric polarization, dielectric polarization, and a term having a technical meaning equivalent thereto.

Although conventional binary systems may be represented with a single ferroelectric polarization direction, in the case of the two-dimensional ferroelectric material according to the present disclosure, an additional ferroelectric polarization direction provided by the anisotropy may represent another state, which may be used in ternary logic.

In one embodiment, referring to FIG. 1B, half of Sn atoms in SnTe may be substituted with Ge atoms in a linear manner, and in this case, anisotropic properties derived from a $GeSnTe_2$ material may occur.

Accordingly, $GeSnTe_2$, which is an atomic-thick two-dimensional ferroelectric material, may have two different ferroelectric states in an orthogonal direction when identified by utilizing density functional theory (DFT). The two ferroelectric states may exhibit different electric polarization values.

In one embodiment, a switching barrier between the states may be about 54.8 meV per two formula units (FUs). The transition temperature of the ferroelectric may be much greater than room temperature on the basis of the known transition temperatures of SnTe and GeTe.

Accordingly, a balanced ternary memory system may be proposed which uses two different polarization states to represent three data sets (e.g., "−1", "0", and "+1") through the memory device using the two-dimensional ferroelectric material according to various embodiments of the present disclosure.

In addition, a one-shot reading/writing process may be performed for a ternary memory through the memory device using the two-dimensional ferroelectric material according to various embodiments of the present disclosure.

In one embodiment, an activation barrier for the polarization switching of $GeSnTe_2$ may be calculated using a nudged elastic band (NEB) method.

In addition, referring to FIG. 1C, the structure of $GeSnTe_2$ may include a homogeneous mixed structure, a vertical chain structure, and a diagonal chain structure depending on the substitution of Ge atoms. It can be seen that the vertical chain structure has the lowest energy among the three structures, and it can also be seen that the anisotropic properties in the structure of $GeSnTe_2$ are achieved from the calculated results.

Figure 2:
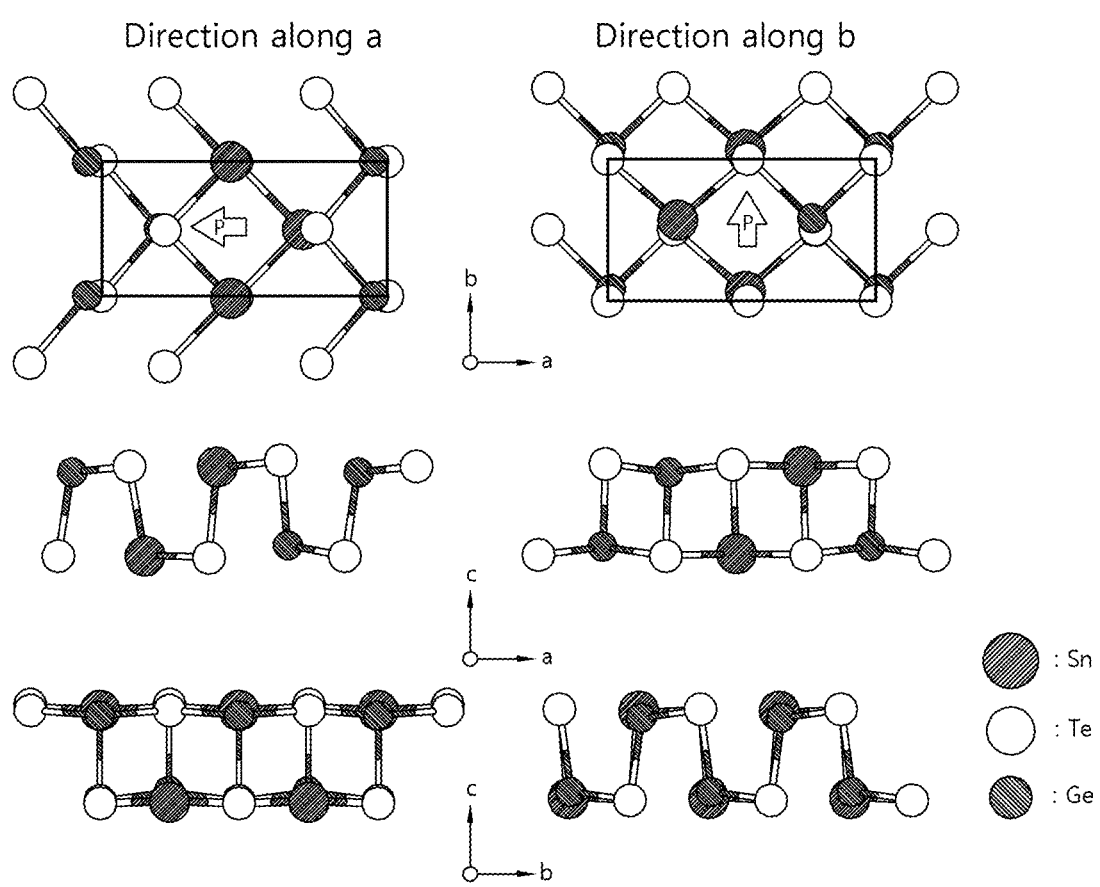
FIG. 2 is a view illustrating two polarization states of $GeSnTe_2$ according to the embodiment of the present disclosure.

FIG. 2 is a view illustrating two polarization states of $GeSnTe_2$ according to the embodiment of the present disclosure.

Referring to FIG. 2, the calculation of the electric polarization may be performed for two different polarization directions of a vertical-chain substitution structure. The electric polarization may be represented by atomic displacement with respect to the positions of Te atoms. In this case, a chain direction may be parallel to a b-axis, and a direction orthogonal to the chain direction may be parallel to an a-axis.

A figure (a-axis direction) in an upper left side of FIG. 2 and a figure (b-axis direction) in an upper right side of FIG. 2 may represent orthogonal and parallel atomic displacements with respect to the chain direction and the electric polarization, respectively. A polarization direction may be indicated by a yellow arrow in FIG. 2. Four stable electric polarization states and multiple ferroelectric properties in a structure of $GeSnTe_2$ monolayer may be confirmed from DFT calculations.

In this case, for each electric polarization-axis, positive and negative states are possible. In consideration of two different electric polarization directions, four different electric polarization states may be obtained, which may be used in a ternary or quaternary system.

The electric polarization values in the direction parallel to the chain and in the direction perpendicular to the chain may be 67.14 $\mu C/cm^2$ and 63.34 $\mu C/cm^2$, respectively. In addition, the relative energy difference between different electric polarization states may be 2.3 meV/FU. Such a small energy difference may indicate that the four states have similar stability.

Figure 3:
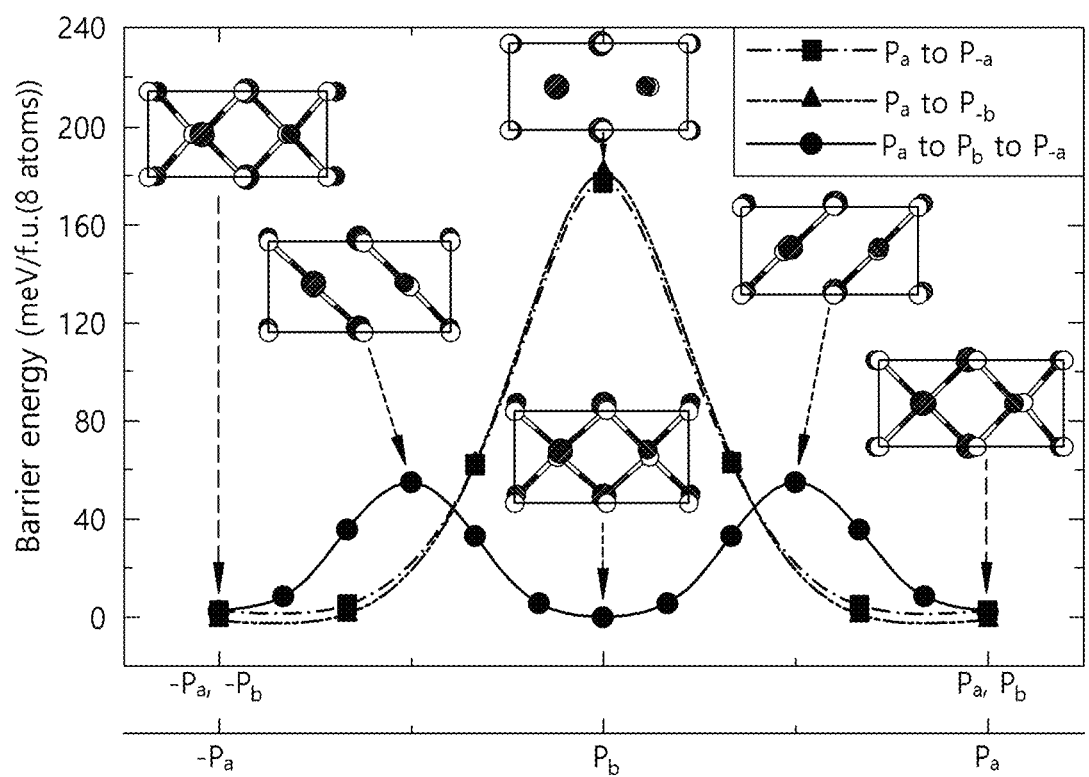
FIG. 3 is a graph illustrating barrier energy according to polarization states according to the embodiment of the present disclosure.

FIG. 3 is a graph illustrating barrier energy according to polarization states according to the embodiment of the present disclosure.

Referring to FIG. 3, in order to find switching barrier energy between the polarization states, an NEB calculation may be performed as shown in FIG. 3. The switching barrier energy may be related to the thermal stability of the polarization state and the application of a voltage to switch the polarization state to another state.

For example, from the calculated results, it can be seen that a direct switching barrier between $P_{-a}$ and $P_a$ is 174.6 meV/2FU, and a switching barrier between $P_{-b}$ and $P_b$ is 182.4 meV/2FU.

However, it can be seen that a rotational switching barrier from $P_a$ to $P_{-a}$ through $P_b$ is only 54.8 meV/2FU. The results of the calculation may indicate that the thermal stability should be considered at a low rotational switching barrier of 54.8 meV/2FU.

When a bias voltage is applied to switch the electric polarization, a lower voltage may be adopted through two-step switching depending on the calculated result. To achieve this type of switching, a first voltage should be applied orthogonally to the polarization state, and a second voltage may be applied to be anti-parallel to an original polarization.

In one embodiment, since the direct switching barrier is at least three times higher than the rotational switching barrier, a higher voltage may be required for direct switching.

Figure 4A:
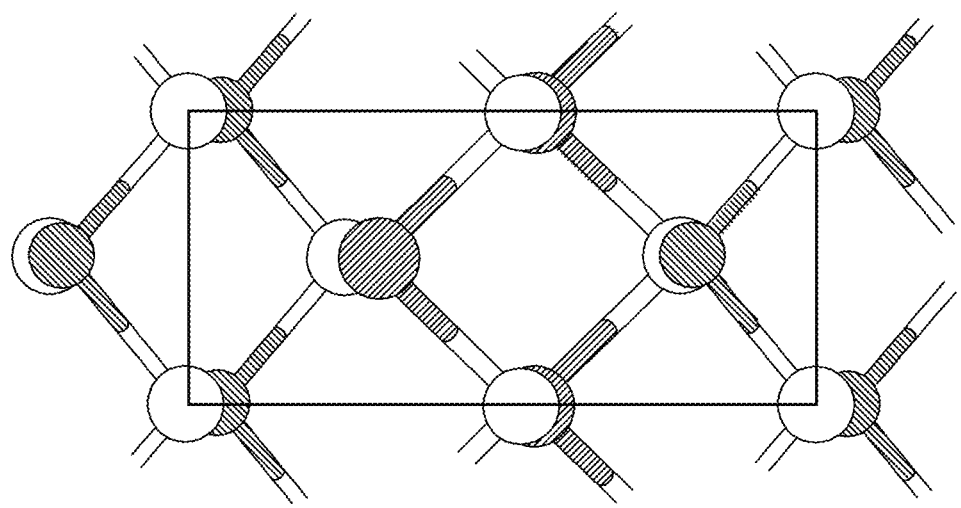
FIG. 4A illustrates a structure of $GeSnTe_2$ in a "−1" state according to the embodiment of the present disclosure.
Figure 4B:
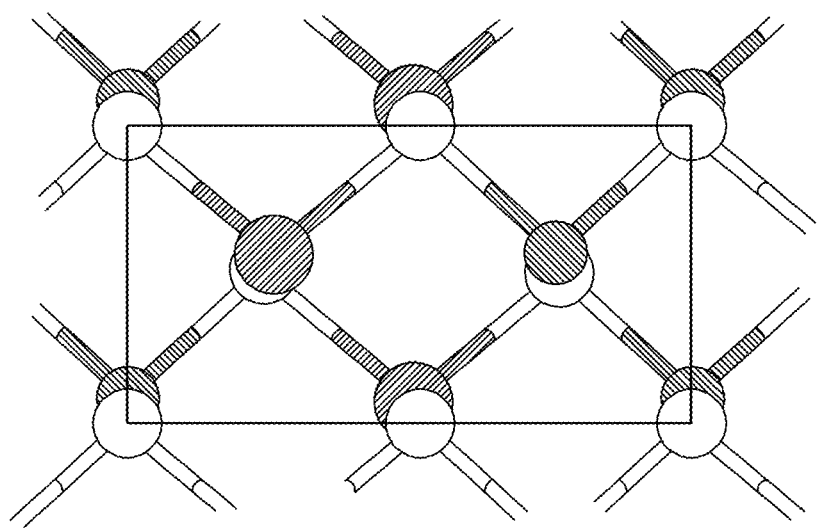
FIG. 4B illustrates a structure of $GeSnTe_2$ in a "0" state according to the embodiment of the present disclosure.
Figure 4C:
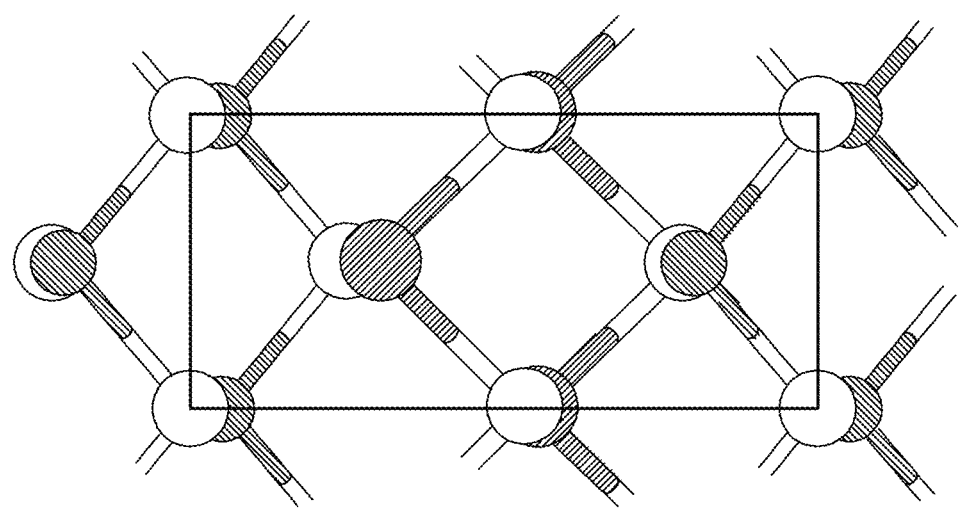
FIG. 4C illustrates a structure $GeSnTe_2$ in a "+1" state according to the embodiment of the present disclosure.
Figure 4D:
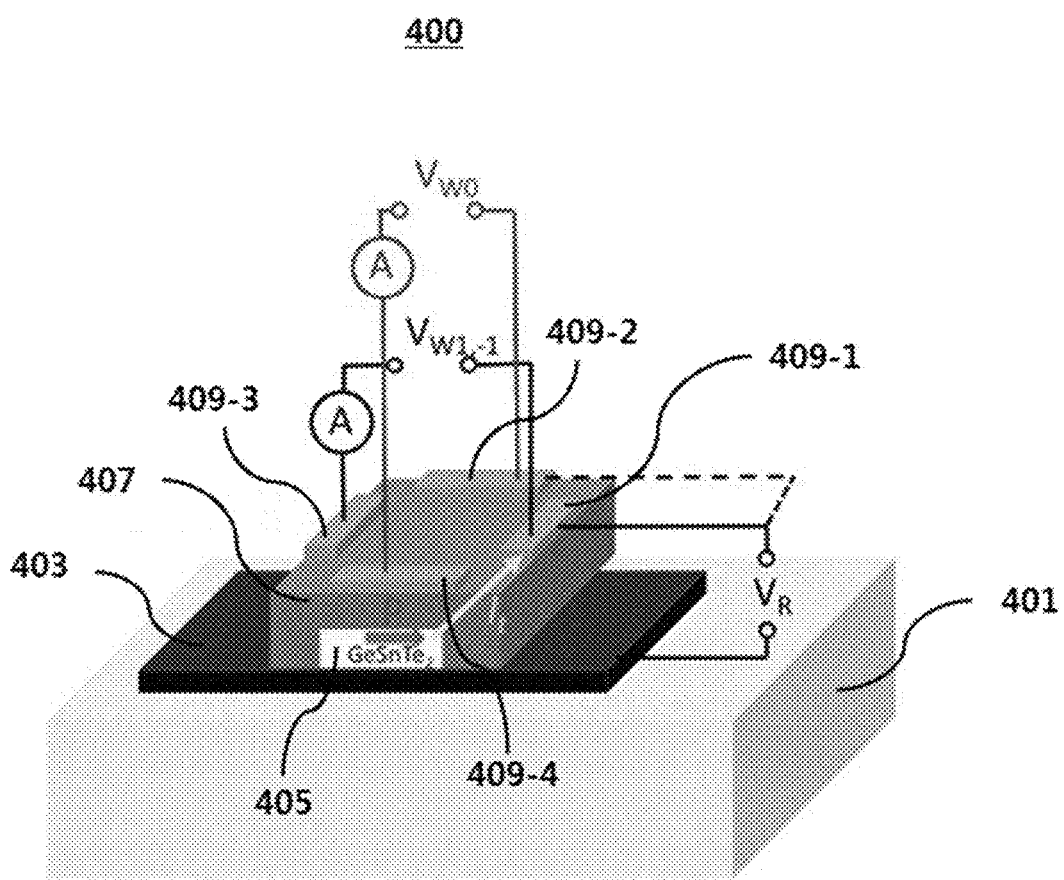
FIG. 4D is a view illustrating a nonvolatile ternary memory device according to the embodiment of the present disclosure.
Figure 4E:
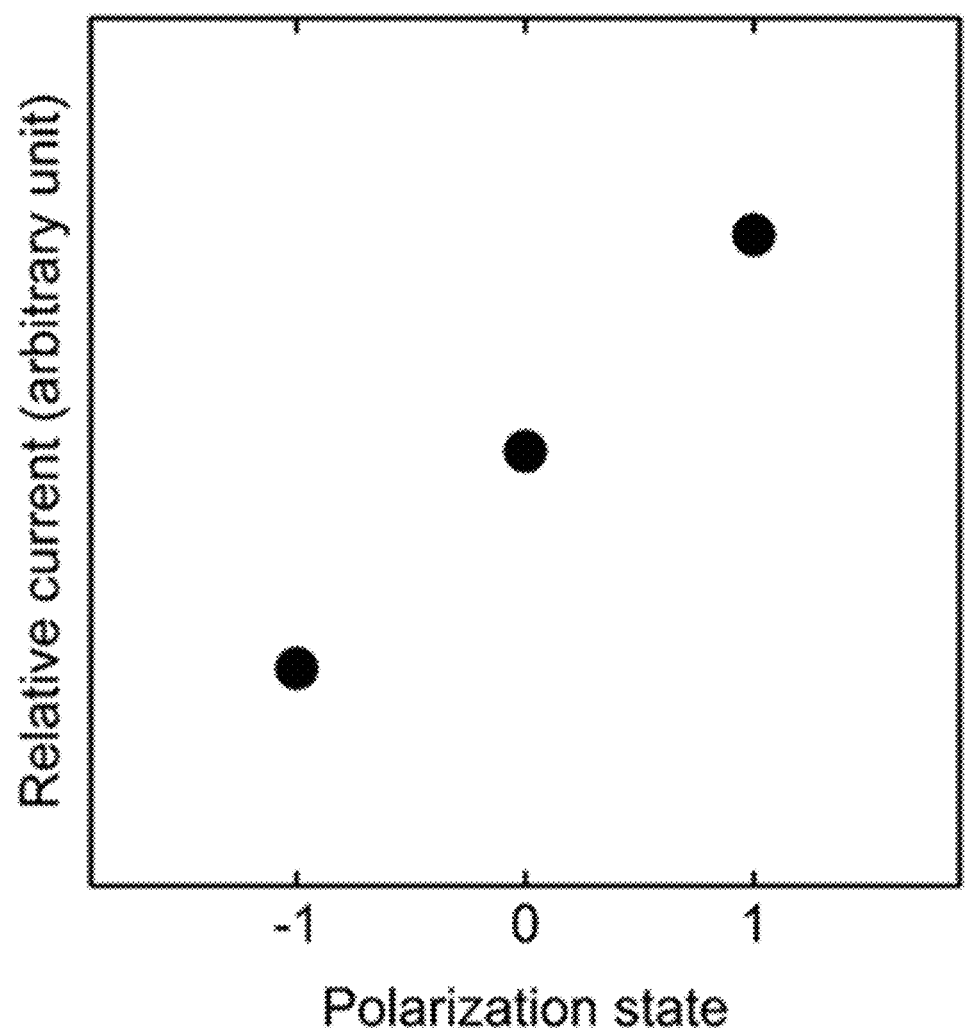
FIG. 4E is a graph illustrating a state current according to a polarization state according to the embodiment of the present disclosure.

FIG. 4A illustrates a structure of $GeSnTe_2$ in a "−1" state according to the embodiment of the present disclosure. FIG. 4B illustrates a structure of $GeSnTe_2$ in a "0" state according to the embodiment of the present disclosure. FIG. 4C illustrates a structure of $GeSnTe_2$ in a "+1" state according to the embodiment of the present disclosure. FIG. 4D is a view illustrating a nonvolatile ternary memory device according to the embodiment of the present disclosure. FIG. 4E is a graph illustrating a state current according to the polarization state according to the embodiment of the present disclosure.

Referring to FIGS. 4A to 4E, a nonvolatile ternary memory device 400 according to various embodiments of the present disclosure may include a substrate 401, a lower electrode 403 formed on the substrate 401, a two-dimensional ferroelectric material 405 formed on the lower electrode 403, a semiconductor 407 formed on the two-dimensional ferroelectric material 405, and an upper electrode 409 formed on the semiconductor 407.

In one embodiment, the two-dimensional ferroelectric material 405 may include at least one from among SnTe, GeTe, and $GeSnTe_2$. For example, the two-dimensional ferroelectric material 405 may include a single layer $GeSnTe_2$.

In one embodiment, the semiconductor 407 may include a semiconductor having a bandgap greater than or equal to a predetermined threshold value.

In one embodiment, the upper electrode 409 may include a first upper electrode 409-1, a second upper electrode 409-2, a third upper electrode 409-3, and a fourth upper electrode 409-4.

In this case, one of the first upper electrode 409-1, the second upper electrode 409-2, the third upper electrode 409-3, and the fourth upper electrode 409-4 may be electrically connected to the lower electrode 403.

For example, for the convenience of description, the first upper electrode 409-1 among the first upper electrode 409-1, the second upper electrode 409-2, the third upper electrode 409-3, and the fourth upper electrode 409-4 may be electrically connected to the lower electrode 403.

In one embodiment, the first upper electrode 409-1 may be electrically connected to the lower electrode 403 through a voltage measuring device.

In one embodiment, the first upper electrode 409-1 may be electrically connected to the third upper electrode 409-3, and the second upper electrode 409-2 may be electrically connected to the fourth upper electrode 409-4.

For example, the first upper electrode 409-1 and the third upper electrode 409-3 may be electrically connected to each other through conductive lines between which a current measuring device and a voltage are applied. In addition, the second upper electrode 409-2 and the fourth upper electrode 409-4 may be electrically connected to each other through conductive lines between which a current measuring device and a voltage are applied.

For example, as illustrated in FIG. 4D, an electric polarization direction of the two-dimensional ferroelectric material 405 is indicated by a red arrow, and a tunneling current between the two-dimensional ferroelectric material 405 and the first upper electrode 409-1 may be indicated by a green arrow.

Here, the first upper electrode 409-1 and the third upper electrode 409-3 may be disposed in a horizontal polarization direction of the two-dimensional ferroelectric material 405, and the second upper electrode 409-2 and the fourth upper electrode 409-4 may be disposed in a vertical polarization direction of the two-dimensional ferroelectric material 405.

In one embodiment, a voltage $V_R$ applied between the first upper electrode 409-1 and the lower electrode 403 may be used to adjust the horizontal polarization direction in a positive direction or a negative direction according to the application direction of the voltage $V_R$.

Further, in one embodiment, the magnitude of the tunneling current between the first upper electrode 409-1 and the lower electrode 403 may be used to represent a ternary state according to the polarization direction of the two-dimensional ferroelectric material.

Here, the tunneling current may be adjusted according to a polarization state of the two-dimensional ferroelectric material 405. A tunneling current in a "−1" state may be set to be lower than a tunneling current in a "+1" state. Since a "0" state has a polarization orthogonal to the electrical polarization corresponding to the states "−1" and "+1", the relative polarization may be zero along the a-axis.

As a result, as shown in FIG. 4E, the tunneling current in the "0" state may be set to be between the "−1" state and the "+1" state. That is, the nonvolatile ternary memory device 400 according to the present disclosure may implement three steps of current by using the two-dimensional ferroelectric material 405.

For example, the ternary state of "+1", "0", and "+1" may be represented by a structure of nanoscale single layer $GeSnTe_2$. Each of the "−1", "0", and "+1" states may be represented by an electric polarization direction (−a-axis) perpendicular to the chain direction, an electric polarization direction (+b-axis) parallel to the chain direction, and an electric polarization direction (+a-axis) perpendicular to the chain direction.

That is, each of the "−1", "0", and "+1" states may be represented by a negative direction of the horizontal polarization direction, a negative direction of the vertical polarization direction, and a positive direction of the horizontal polarization direction.

In one embodiment, a voltage $V_{w1,-1}$ between the first upper electrode 409-1 and the third upper electrode 409-3 and a voltage $V_{w0}$ between the second upper electrode 409-2 and the fourth upper electrode 409-4 may be used for a writing process. Here, the voltage $V_{W1,-1}$ and the voltage $V_{W0}$ may mean two-directional bias voltages.

For example, in order to write the "1" state or the "−1" state, the bias voltage $V_{w1,-1}$ may be applied between the first upper electrode 409-1 and the third upper electrode 409-3. When a positive bias voltage or a negative bias voltage is applied according to the direction in which the voltage is applied, the polarization direction of the two-dimensional ferroelectric material 405 may be adjusted to be positive or negative along the a-axis.

The bias voltage $V_{w0}$ may be applied between the second upper electrode 409-2 and the fourth upper electrode 409-4 to write the "0" state. In this case, the final polarization direction appears along the b-axis and the polarization may not appear along the a-axis. All such writing/reading processes may be performed in a one-step process.

In addition, the voltage $V_R$ between the first upper electrode 409-1 and the lower electrode 403 may be used for the reading process.

That is, the writing process may be performed by measuring the voltage $V_{w1,-1}$ between the first upper electrode 409-1 and the third upper electrode 409-3 and the voltage $V_{w0}$ between the second upper electrode 409-2 and the fourth upper electrode 409-4. In addition, the reading process may be performed by measuring the voltage $V_R$ between the first upper electrode 409-1 and the lower electrode 403

That is, in the nonvolatile ternary memory device 400 according to the present disclosure, the magnitude of the ferroelectric polarization varies according to the direction in which the electric field is applied, and the amount of current may be represented in three steps so that a ternary logic system may be applied.

In one embodiment, the first upper electrode 409-1 and the second upper electrode 409-2 may be connected to each other. In this case, the first upper electrode 409-1 and the second upper electrode 409-2 may be connected through a conductive line (i.e., a dashed line in FIG. 4D) configured to connect therebetween.

The conductive line may not be required for ternary logic but may be used in quaternary logic. When the conductive line is used, the tunneling current between the two-dimensional ferroelectric material 405 and the first upper electrode 409-1 may be affected by the polarization direction along the b-axis. In other words, a positive electrode and a negative electrode may exhibit different tunneling currents along the b-axis. By adding the conductive line in this manner, a quaternary logic system may be implemented with a binary memory device using the two-dimensional ferroelectric material according to various embodiments of the present disclosure.

In one embodiment, regarding the orthorhombic structure and stability of $GeSnTe_2$, the low-temperature phase of SnTe is a rhombohedron, and the orthorhombic phase may be used at high pressure.

For example, a ferroelectric phase transition temperature may be 270K for a single layer SnTe. In the case of GeTe, GeTe may have two low-temperature phases, such as the rhombohedron and the orthorhombic phase.

In the case of GeTe in which the Te content exceeds 51.2%, the orthorhombic phase may be stable up to 630 K. GeSnTe$_2$ may be stable at room temperature according to the single-layer orthorhombic phase SnTe and bulk-orthorhombic phase GeTe structures. By mixing SnTe and GeTe, the ferroelectric phase transition temperature of GeSnTe$_2$ may be between 270 K and 630 K.

Assuming a linear relationship, the transition temperature is 450K and may be greater than room temperature. In addition, the possibility of phase segregation may be considered in a synthesis process.

According to the calculation, a phase separation structure having a grain boundary may be lower in energy than a mixed GeSnTe$_2$ structure. In one embodiment, the ternary memory device may also be implemented in a single layer SnTe or GeTe.

In summary, it can be seen that the two different polarization directions and the magnitude of the ferroelectric polarization as the multiple ferroelectric properties of GeSnTe$_2$ are stable in the atomic-thick two-dimensional structure. The ferroelectric state of GeSnTe$_2$ may be used to represent a balanced ternary data set of "−1", "0", and "+1" or a quaternary data set according to the implementation method.

Due to the ferroelectric properties, GeSnTe$_2$ has the advantages of nonvolatile characteristics and low power consumption.

FIG. 5 is a view illustrating a method of manufacturing a nonvolatile ternary memory device according to an embodiment of the present disclosure.

Referring to FIG. 5, a process S501 is a process of forming a lower electrode 403 on a substrate 401.

A process S503 is a process of forming a two-dimensional ferroelectric material 405 on the lower electrode 403. In one embodiment, the two-dimensional ferroelectric material 405 may include at least one from among SnTe, GeTe, and GeSnTe$_2$.

A process S505 is a process of forming a semiconductor 407 on the two-dimensional ferroelectric material 405.

A process S507 is a process of forming an upper electrode 409 on the semiconductor 407. In one embodiment, the upper electrode 409 may include a first upper electrode 409-1, a second upper electrode 409-2, a third upper electrode 409-3, and a fourth upper electrode 409-4.

In one embodiment, one of the first upper electrode 409-1, the second upper electrode 409-2, the third upper electrode 409-3, and the fourth upper electrode 409-4 may be electrically connected to the lower electrode 403 after the process S507.

In one embodiment, a voltage $V_R$ applied between the first upper electrode 409-1 and the lower electrode 403 may be used to adjust a horizontal polarization direction in a positive direction or a negative direction according to the application direction of the voltage $V_R$.

Further, the magnitude of a tunneling current between the first upper electrode 409-1 and the lower electrode 403 may be used to represent a ternary state according to a polarization direction of the two-dimensional ferroelectric material 405.

For example, the first upper electrode 409-1 among the first upper electrode 409-1, the second upper electrode 409-2, the third upper electrode 409-3, and the fourth upper electrode 409-4 may be electrically connected to the lower electrode 403.

In one embodiment, the first upper electrode 409-1 may be electrically connected to the third upper electrode 409-3, and the second upper electrode 409-2 may be electrically connected to the fourth upper electrode 409-4.

In this case, the first upper electrode 409-1 and the third upper electrode 409-3 may be disposed in a horizontal polarization direction of the two-dimensional ferroelectric material 405. In addition, the second upper electrode 409-2 and the fourth upper electrode 409-4 may be disposed in a vertical polarization direction of the two-dimensional ferroelectric material 405.

In one embodiment, a voltage $V_{w1,-1}$ between the first upper electrode 409-1 and the third upper electrode 409-3 and a voltage $V_{w0}$ between the second upper electrode 409-2 and the fourth upper electrode 409-4 may be used for a writing process. In addition, a voltage $Y_R$ between the first upper electrode 409-1 and the lower electrode 403 may be used for a reading process.

In one embodiment, the first upper electrode 409-1 and the second upper electrode 409-2 may be electrically connected to each other through a conductive line.

According to an embodiment of the present disclosure, energy efficiency and structural simplification of the ternary memory device can be secured by representing a ternary state according to the magnitude of a tunneling current in a polarization direction of the two-dimensional ferroelectric material.

It should be noted that the effects of the present disclosure are not limited to the above-described effects, and other effects of the present disclosure will be apparent to those skilled in the art from the foregoing description.

Although the embodiments have been described with reference to a number of illustrative embodiments thereof, it should be understood that numerous other modifications and changes can be devised by those skilled in the art without departing from the essential features of the present disclosure.

Therefore, the embodiments of the present disclosure are not intended to limit but are intended to illustrate the technical idea of the present disclosure, and the scope of the technical idea of the present disclosure is not limited by the embodiments.

The scope of the present disclosure shall be construed on the basis of the accompanying claims in such a manner that all of the technical ideas included within the scope equivalent to the claims belong to the present disclosure.

What is claimed is:

1. A method of manufacturing a nonvolatile ternary memory device, the method comprising:
   (a) forming a lower electrode on a substrate;
   (b) forming a two-dimensional ferroelectric material on the lower electrode;
   (c) forming a semiconductor on the two-dimensional ferroelectric material; and
   (d) forming an upper electrode on the semiconductor,
   wherein the upper electrode includes a first upper electrode, a second upper electrode, a third upper electrode, and a fourth upper electrode.

2. The method of claim 1, wherein the two-dimensional ferroelectric material includes at least one from among SnTe, GeTe, and GeSnTe$_2$.

3. The method of claim 1, further comprising, after the process (d), electrically connecting the first upper electrode among the first upper electrode, the second upper electrode, the third upper electrode, and the fourth upper electrode to the lower electrode.

4. The method of claim 3, further comprising, after the process (d), electrically connecting the first upper electrode to the third upper electrode and electrically connecting the second upper electrode to the fourth upper electrode.

5. The method of claim 4, wherein
the first upper electrode and the third upper electrode are disposed in a horizontal polarization direction of the two-dimensional ferroelectric material, and
the second upper electrode and the fourth upper electrode are disposed in a vertical polarization direction of the two-dimensional ferroelectric material.

6. The method of claim 5, wherein a voltage applied between the first upper electrode and the lower electrode is used to adjust a positive direction or a negative direction of the horizontal polarization direction according to a direction in which the voltage is applied.

7. The method of claim 5, wherein a magnitude of a tunneling current between the first upper electrode and the lower electrode is used to represent a ternary state according to a polarization direction of the two-dimensional ferroelectric material.

8. The method of claim 5, wherein
a voltage between the first upper electrode and the third upper electrode and a voltage between the second upper electrode and the fourth upper electrode are used for a writing process, and
a voltage between the first upper electrode and the lower electrode is used for a reading process.

9. The method of claim 5, wherein the first upper electrode and the second upper electrode are electrically connected to each other through a conductive line.

10. A nonvolatile ternary memory device comprising:
a substrate;
a lower electrode formed on the substrate;
a two-dimensional ferroelectric material formed on the lower electrode;
a semiconductor formed on the two-dimensional ferroelectric material; and
an upper electrode formed on the semiconductor,
wherein the upper electrode includes a first upper electrode, a second upper electrode, a third upper electrode, and a fourth upper electrode.

11. The nonvolatile ternary memory device of claim 10, wherein the two-dimensional ferroelectric material includes at least one from among SnTe, GeTe, and GeSnTe$_2$.

12. The nonvolatile ternary memory device of claim 10, wherein the first upper electrode among the first upper electrode, the second upper electrode, the third upper electrode, and the fourth upper electrode is electrically connected to the lower electrode.

13. The nonvolatile ternary memory device of claim 12, wherein
the first upper electrode is electrically connected to the third upper electrode, and
the second upper electrode is electrically connected to the fourth upper electrode.

14. The nonvolatile ternary memory device of claim 13, wherein
the first upper electrode and the third upper electrode are disposed in a horizontal polarization direction of the two-dimensional ferroelectric material, and
the second upper electrode and the fourth upper electrode are disposed in a vertical polarization direction of the two-dimensional ferroelectric material.

15. The nonvolatile ternary memory device of claim 14, wherein a voltage applied between the first upper electrode and the lower electrode is used to adjust a positive direction or a negative direction of the horizontal polarization direction according to a direction in which the voltage is applied.

16. The nonvolatile ternary memory device of claim 14, wherein a magnitude of a tunneling current between the first upper electrode and the lower electrode is used to represent a ternary state according to a polarization direction of the two-dimensional ferroelectric material.

17. The nonvolatile ternary memory device of claim 14, wherein
a voltage between the first upper electrode and the third upper electrode and a voltage between the second upper electrode and the fourth upper electrode are used for a writing process, and
a voltage between the first upper electrode and the lower electrode is used for a reading process.

18. The nonvolatile ternary memory device of claim 14, wherein the first upper electrode and the second upper electrode are electrically connected to each other through a conductive line.

* * * * *